(12) United States Patent
Kurihara

(10) Patent No.: US 6,255,843 B1
(45) Date of Patent: Jul. 3, 2001

(54) SEMICONDUCTOR INTEGRATED CIRCUIT TESTING APPARATUS AND COMPOSITE SEMICONDUCTOR INTEGRATED CIRCUIT TESTING APPARATUS

(75) Inventor: Osamu Kurihara, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/387,478

(22) Filed: Sep. 1, 1999

(30) Foreign Application Priority Data

Sep. 1, 1998 (JP) .................................. 10-247445

(51) Int. Cl.[7] .................................................. G01R 31/26
(52) U.S. Cl. ......................................... 324/765; 324/158.1
(58) Field of Search .......................... 324/158.1, 765, 324/73.1; 714/724, 736; 702/117, 119

(56) References Cited

U.S. PATENT DOCUMENTS 4,637,020 * 1/1987 Schinabeck ........................... 714/736
5,142,223 * 8/1992 Higashino et al. .................. 714/724

* cited by examiner

*Primary Examiner*—Ernest Karlsen
*Assistant Examiner*—Minh Tang
(74) *Attorney, Agent, or Firm*—Gallagher & Lathrop; David N. Lathrop

(57) ABSTRACT

There is provided an inexpensive composite IC tester that can test an IC having many pins. There are provided in each of IC testers proper a disconnecting device for disconnecting a controller from a tester bus, a bus connector, an original clock stopper for stopping the operation of an original clock generator of a timing generator, a synchronous signal transmission path or line for transmitting a synchronous signal, and a synchronous transmission path connector. The tester buses of the IC testers proper are connected with one another by their bus connectors, and at the same time the synchronous signal transmission paths are connected with one another by their synchronous transmission path connectors so that the controller of specified one of the IC testers proper can control the timing generators, pattern generators, waveform formatters, logical comparators, failure analysis memories, and voltage generators of all the IC testers proper, thereby to test an IC under test having many pins.

15 Claims, 5 Drawing Sheets

SEMICONDUCTOR INTEGRATED CIRCUIT TESTING APPARATUS AND COMPOSITE SEMICONDUCTOR INTEGRATED CIRCUIT TESTING APPARATUS

BACKGROUND OF THE INVENTION

1. Field of the Invention

The present invention relates to a semiconductor integrated circuit testing apparatus for testing various kinds of semiconductor integrated circuits (a semiconductor integrated circuit will be hereinafter referred to as IC) and a composite semiconductor integrated circuit testing apparatus that is constructed such that a plurality of semiconductor integrated circuit testing apparatus of such type are combined so as to be able to test a large scale integrated circuit (LSI), particularly a large scale integrated circuit having many pins.

2. Description of the Related Art

As is well known, in this technical field, a semiconductor integrated circuit (hereinafter referred to as IC) in which a logic circuit portion (logic portion) is dominant is called "logic IC", and a semiconductor integrated circuit in which a memory portion is dominant is called "memory IC". In addition, an IC in which a logic portion and a memory portion are present in mixture on one chip is called "System LSI" (Systematic Large Scale Integrated Circuit), "System On Chip" (SOC) or the like.

FIG. 4 shows, in outline, a configuration of the general IC testing apparatus (hereinafter referred to as an IC tester) that has conventionally been used. The illustrated IC tester comprises an IC tester proper 100 and a test head 200. The IC tester proper 100 comprises, in this example, a controller 101, a timing generator 102, a pattern generator 103, a waveform formatter 104, a driver 105, a comparator 106, a logical comparator 107, a failure analysis memory 108 and a voltage generator 109.

The test head 200 is constructed separately from the IC tester proper 100, and usually has a predetermined number of IC sockets (not shown) mounted on its top portion. In addition, within the test head 200 is accommodated a printed board called "pin card" in this technical field. A circuit containing the driver 105 and the comparator 106 of the IC tester proper 100 is usually formed on the pin card. In general, the test head 200 is mounted to a test section of an IC transporting and handling apparatus called "handler" in this technical field. The test head 200 is electrically connected to the IC tester proper 100 by signal transmission means such as cables, optical fibers or the like.

An IC to be tested (IC under test) 300 is mounted on an IC socket on the test head 200, through which a test pattern signal is applied to the IC under test (generally referred to as DUT) 300 from the IC tester proper 100 as well as a response signal from the IC under test 300 is supplied to the IC tester proper 100 in order to test and measure the IC under test 300.

The controller 101 is constituted by a computer system, in which a test program created by a user (programmer) is stored, and the entire IC tester is controlled in accordance with the test program. As can be easily understood by referring to FIG. 5, the controller 101 is connected to the timing generator 102, the pattern generator 103, the waveform formatter 104, the logical comparator 107, the failure analysis memory 108, the voltage generator 109, and the like via a tester bus 111. These timing generator 102, pattern generator 103, waveform formatter 104, logical comparator 107, failure analysis memory 108, voltage generator 109, and the like operate as terminal devices and carry out a test for the IC under test 300 in accordance with control instructions or commands outputted from the controller 101.

A test, for example, a functional test for the IC under test is performed as follows.

A pattern generating sequence described in the test program stored in the controller 101 is previously stored in the pattern generator 103 prior to the start of a test. When a test start instruction is given thereto from the controller 101, the pattern generator 103 outputs test pattern data to be applied to the IC under test 300 in accordance with the stored pattern generating sequence. As the pattern generator 103, an ALPG (Algorithmic Pattern Generator) is generally used. The ALPG is a pattern generator that generates a test pattern to be applied to a semiconductor device (for example, an IC) by an arithmetic and logic operation or computation using internal registers each having an arithmetic and logic function or computing function.

Timing generator 102 has timing data previously stored therein prior to the start of a test, the timing data being described in the test program stored in the controller 101 and outputted for every test period. The timing generator 102 outputs a clock pulse for each test period in accordance with the stored timing data. This clock pulse is supplied to the waveform formatter 104, the logical comparator 107 and the like.

The waveform formatter 104 defines a rise timing and a fall timing of a logical waveform, based on the test pattern data outputted from the pattern generator 103 and the clock pulse outputted from the timing generator 102, to produce a test pattern signal having a real waveform that changes from/to logical H (logical "1") to/from logical L (logical "0"). This test pattern signal is applied to the IC under test 300 via the driver 105.

The driver 105 defines the amplitude of the test pattern signal outputted from the waveform formatter 104 to a desired amplitude (logical H, i.e., voltage VIH of logical "1" and logical L, i.e., voltage VIL of logical "0") and applies such test pattern signal to the IC socket of the test head 200, thereby to drive the IC under test 300.

The comparator 106 determines whether or not a logical value of a response signal outputted from the IC under test 300 has a normal voltage value. That is, the comparator 106 determines whether or not a voltage of logical H has a value equal to or greater than a defined voltage value VOH and whether or not a voltage of logical L has a value equal to or less than a defined voltage value VOL. In the case that the determination result indicates a failure, the comparator 106 outputs a signal of logical H (logical "1") indicating the failure.

An output signal based on the determination result of the comparator 106 is supplied to the logical comparator 107 where the output signal is compared with an expected value pattern data supplied from the pattern generator 103 to determine whether or not the IC under test 300 has outputted a normal response signal.

The comparison result of the logical comparator 107 is taken in the failure analysis memory 108. In the case that a failure has occurred, the test pattern address of the failure, the output logical data of the failure pin of the IC under test 300, and the expected value pattern data at that time are stored in the failure analysis memory 108, and these data are utilized for an evaluation of the LSI after the completion of the test.

The voltage generator 109 generates amplitude voltages VIH and VIL to be applied to the driver 105, and comparison voltages VOH and VOL to be applied to the comparator 106, in accordance with a set value being sent from the controller 101. As a result, there is generated from the driver 105 a driving signal having an amplitude value which fulfills the standard of the IC under test 300. In addition, the comparator 106 can determine whether or not the response signal from the IC under test 300 has a logical value of the voltage fulfilling the standard of the IC under test 300.

FIG. 4 is illustrated such that a test pattern signal outputted from the driver 105 is applied to only one pin of the IC under test 300 and that a response signal from that one pin of the IC under test 300 is supplied to the comparator 106. However, in practice, a predetermined number, for example, 512 of drivers 105 are provided, and also the same predetermined number (512) of comparators 106 as that of the drivers 105 are provided. In FIG. 5, in order to simplify the figure, each of the components (the controller 101, the timing generator 102, the pattern generator 103, the waveform formatter 104, the logical comparator 107, the failure analysis memory 108 and the voltage generator 109) except the drivers 105 and the comparators 106 is shown as one block, but in reality the remaining components except the controller 101 and the timing generator 102 are also provided by the same number (512) as that of the drivers 105, respectively. That is, only the controller 101 and the timing generator 102 are used in common to each of the pins of the IC under test 300.

As mentioned above, since the circuit containing the drivers 105 and the comparators 106 of the IC tester proper 100 is usually accommodated in the test head 200, in practice, the waveform formatter 104 and the logical comparator 107 of the IC tester proper 100 are electrically connected to the drivers 105 and the comparators 106 within the test head 200 by signal transmission paths or lines such as, for example, 512 cables, 512 optical fibers or the like.

For example, in the case that the illustrated IC tester is provided with 512 drivers 105 and 512 comparators 106, if the number of pins of the IC under test 300 shown in FIG. 4 is equal to or less than 512, all of the pins are connected to the output terminals of the corresponding drivers and the input terminals of the corresponding comparators through the IC socket, respectively. In general, a signal transmission path or line connecting between the IC tester proper 100 and the test head 200 is called "channel", and the number of signal transmission paths or lines is called "the number of channels".

As discussed above, the timing generator 102, the pattern generator 103, the waveform formatter 104, the logical comparator 107, the failure analysis memory 108 and the voltage generator 109 shown in FIG. 4 are treated as terminal devices connected to the tester bus 111. Therefore, if the entire configuration of the IC tester proper 100 shown in FIG. 4 is depicted in a hierarchical structure, it is as shown in FIG. 5. Further, although the IC tester proper 100 is shown as one block, the IC tester proper 100 comprises a plurality of, for example, 512 pattern generators 103, 512 waveform formatters 104, 512 logical comparators 107, 512 failure analysis memories 108, and 512 voltage generators 109. In addition, 512 drivers 105 and 512 comparators 106 shown within the IC tester proper 100 are usually accommodated within the test head 200, and the waveform formatters 104 and the logical comparators 107 are electrically connected to the drivers 105 and the comparators 106 by 512 signal transmission paths, respectively. Consequently, this IC tester is provided with 512 channels.

As can be understood from FIG. 5, the maximum number of pins of the IC under test 300 that can be tested by the conventional IC tester is mainly determined by the number of the waveform formatters 104 and the number of the logical comparators 107, that is, the number of channels that the IC tester is provided with. Therefore, it is impossible to test an IC having its pins the number of which exceeds the number of channels of the IC tester. In other words, the maximum number of pins that can be tested has been limited to a finite value that is the same as the number of waveform formatters 104 and the number of logical comparators 107 provided in the IC tester proper 100, for example, 512 pins.

On the contrary, in current circumstances, the number of kinds or types of ICs tends to increase, and the scale (the density of integration) thereof also tends to be expanding. Particularly, in the case of an IC in which a logic portion and a memory portion are present in mixture on one chip (a logic/memory mixed IC), it has a multiplicity of pins such as of the order of 1300 pins in total resulting from 1200 pins or so for the logic portion and 100 pins or so for the memory portion, for instance.

In the case of testing such IC having many pins as mentioned above, an IC tester especially developed for an IC having many pins is needed. Currently, there is available an IC tester that can test an IC the number of pins of which is approximately 1300 or so. However, there is a serious drawback that such IC tester is extremely expensive, and the economical burden on a user is very large.

SUMMARY OF THE INVENTION

It is an object of the present invention to provide a general purpose IC tester which can be diverted to an IC tester that can test even an IC having a multiplicity of pins.

It is another object of the present invention to provide a composite IC tester having a structure in which a plurality of general purpose IC testers are combined, which is capable of testing an IC having a multiplicity of pins without imposing a heavy economical burden on a user.

In order to accomplish the above objects, in a first aspect of the present invention, there is provided a semiconductor integrated circuit testing apparatus which comprises: a controller constituted by a computer system; a tester bus connected to the controller; and a plurality of terminal devices including timing generating means, the terminal devices being connected to the tester bus for receiving control instructions, commands, data or the like sent from the controller via the tester bus, and further comprises: disconnecting means for disconnecting the controller from the tester bus; bus connecting means for enabling to connect the tester bus to a tester bus of another semiconductor integrated circuit testing apparatus; original clock stopping means for stopping the operation of an original clock generator of the timing generating means; synchronous signal transmission means connected to the timing generating means; and synchronous signal transmission means connecting means for enabling to connect the synchronous signal transmission means to synchronous signal transmission means of another semiconductor integrated circuit testing apparatus.

The aforesaid semiconductor integrated circuit testing apparatus further includes a test head which is constructed separately from the aforesaid semiconductor integrated circuit testing apparatus and is provided with a socket on which a semiconductor integrated circuit under test is to be mounted.

In case a semiconductor integrated circuit under test is tested by the aforesaid semiconductor integrated circuit testing apparatus, the disconnecting means is not operated, the controller and the tester bus are maintained in the state that they are being connected with each other, and the original clock stopping means is not operated so that the original clock generator of the timing generating means is maintained in operating state.

In a preferred embodiment, the terminal devices except the timing generating means include pattern generating means, a waveform formatter, logical comparator means, a failure analysis memory, and voltage generating means.

By use of the semiconductor integrated circuit testing apparatus constructed as mentioned above, it is possible to construct a composite semiconductor integrated circuit testing apparatus that can test a semiconductor integrated circuit having a multiplicity of pins.

Therefore, in a second aspect of the present invention, there is provided a composite semiconductor integrated circuit testing apparatus in which: a plurality of semiconductor integrated circuit testing apparatus each of which is constructed as mentioned above are prepared; the tester buses of the plurality of semiconductor integrated circuit testing apparatus are connected with each other by their respective tester bus connecting means; and the synchronous signal transmission means of the plurality of semiconductor integrated circuit testing apparatus are connected with each other by their respective synchronous signal transmission means connecting means.

The test heads of the aforesaid plurality of semiconductor integrated circuit testing apparatus are combined into one composite test head to which is mounted a socket on which a semiconductor integrated circuit under test having a multiplicity of pins can be mounted.

In case a semiconductor integrated circuit under test having a multiplicity of pins is tested by the aforesaid composite semiconductor integrated circuit testing apparatus, only the disconnecting means of specified one of the aforesaid plurality of semiconductor integrated circuit testing apparatus is not operated, thereby to maintain the controller and the tester bus thereof in the state that they are being connected with each other, the disconnecting means of the remaining semiconductor integrated circuit testing apparatus being operated thereby maintaining the associated controller and the associated tester bus in the state that they are being disconnected from each other; and only the original clock stopping means of the aforesaid specified one semiconductor integrated circuit testing apparatus is not operated, thereby to maintain the original clock generator of the timing generating means thereof in operating state, the original clock stopping means of the remaining semiconductor integrated circuit testing apparatus being operated thereby maintaining the original clock generator of the associated timing generating means in unoperated state.

In a preferred embodiment, specified one of the aforesaid plurality of semiconductor integrated circuit testing apparatus is defined to be a main semiconductor integrated circuit testing apparatus in which the controller and the tester bus thereof are connected with each other so that it operates in normal mode, the remaining semiconductor integrated circuit testing apparatus being defined to be a sub semiconductor integrated circuit testing apparatus in which the controller and the tester bus thereof are disconnected from each other and the original clock generator of the timing generating means thereof is controlled to be in stopped state. The tester bus of the main semiconductor integrated circuit testing apparatus is connected to the tester bus or buses of the sub semiconductor integrated circuit testing apparatus so that the sub semiconductor integrated circuit testing apparatus can be operated by the controller of the main semiconductor integrated circuit testing apparatus, and hence the composite semiconductor integrated circuit testing apparatus is capable of testing a semiconductor integrated circuit having its pins up to the sum of the number of pins that can be tested by the main semiconductor integrated circuit testing apparatus and the number of pins that can be tested by the sub semiconductor integrated circuit testing apparatus.

With the semiconductor integrated circuit testing apparatus according to the first aspect of the present invention, it can usually be utilized as a general purpose semiconductor integrated circuit testing apparatus that can test a semiconductor integrated circuit having up to, for example, 512 pins. Moreover, in case a semiconductor integrated circuit having its pins more than 512 pins should be tested, a composite semiconductor integrated circuit testing apparatus provided with many channels can be constructed merely by selecting the number of semiconductor integrated circuit testing apparatus to be combined depending on the number of pins of the semiconductor integrated circuit under test, connecting the tester buses of these plurality of semiconductor integrated circuit testing apparatus with each other through their respective tester bus connecting means, and connecting the synchronous signal transmission means of the aforesaid plurality of semiconductor integrated circuit testing apparatus with each other through their respective synchronous signal transmission means connecting means.

Heretofore, in the development of semiconductor integrated circuits, the number of pins of a semiconductor integrated circuit is limited by the number of pins that can be tested by a semiconductor integrated circuits testing apparatus for testing and measuring the semiconductor integrated circuit. However, according to the present invention, it is possible to develop semiconductor integrated circuits without paying any attention to the number of pins that can be tested by a semiconductor integrated circuit testing apparatus.

DETAILED DESCRIPTION OF THE PREFERRED EMBODIMENTS

Figure 1:
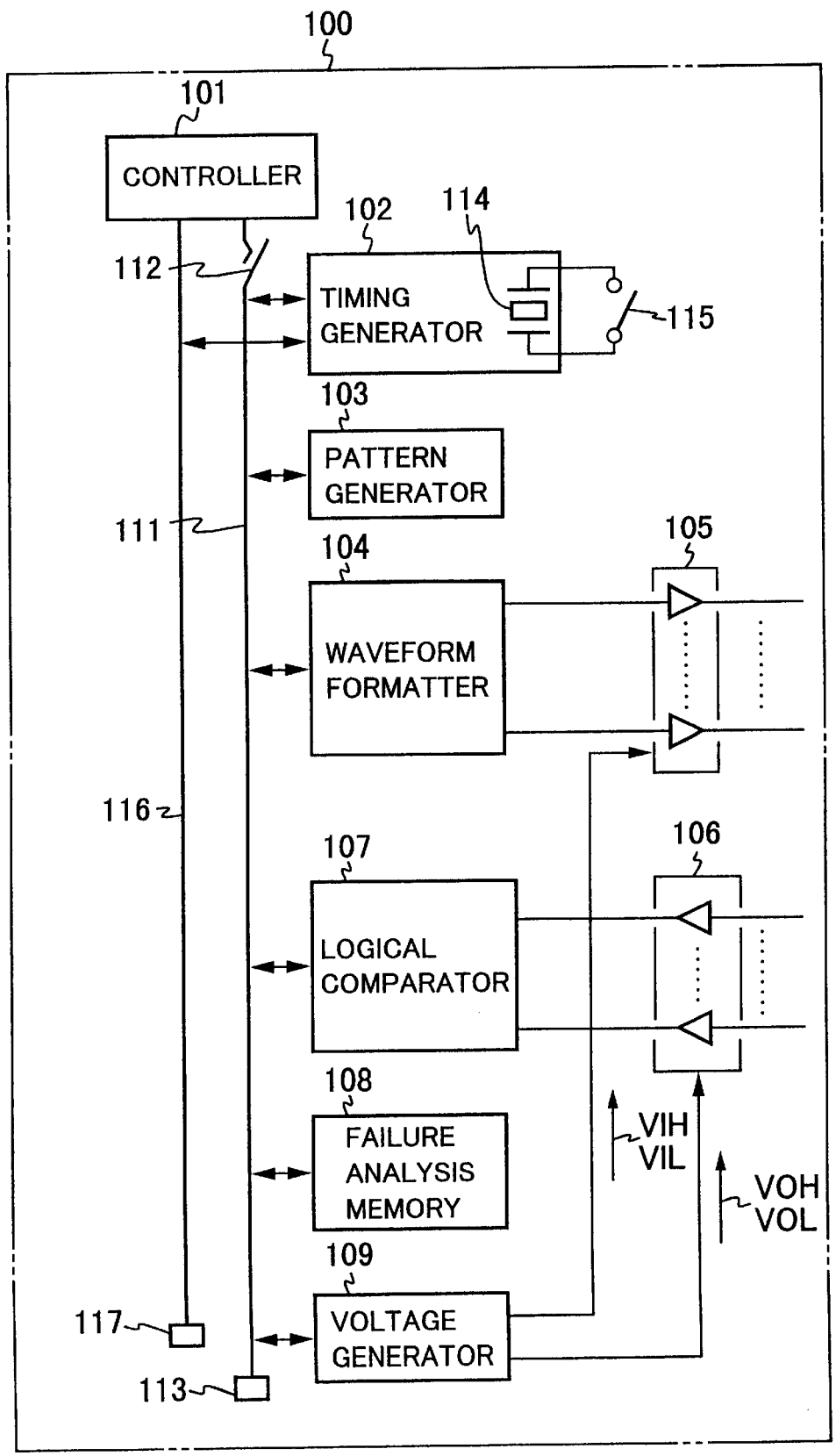
FIG. 1 is a block diagram showing, in hierarchical structure, a basic configuration of an embodiment of the IC tester according to the present invention.

Now an IC tester and a composite IC tester according to the present invention will be described relative to their embodiments in detail with reference to FIGS. 1 to 3. Further, portions and elements in FIGS. 1 to 3 corresponding to those in FIG. 5 will be shown by the same reference characters affixed thereto, and the explanation thereof will be omitted unless it is necessary.

Figure 2:
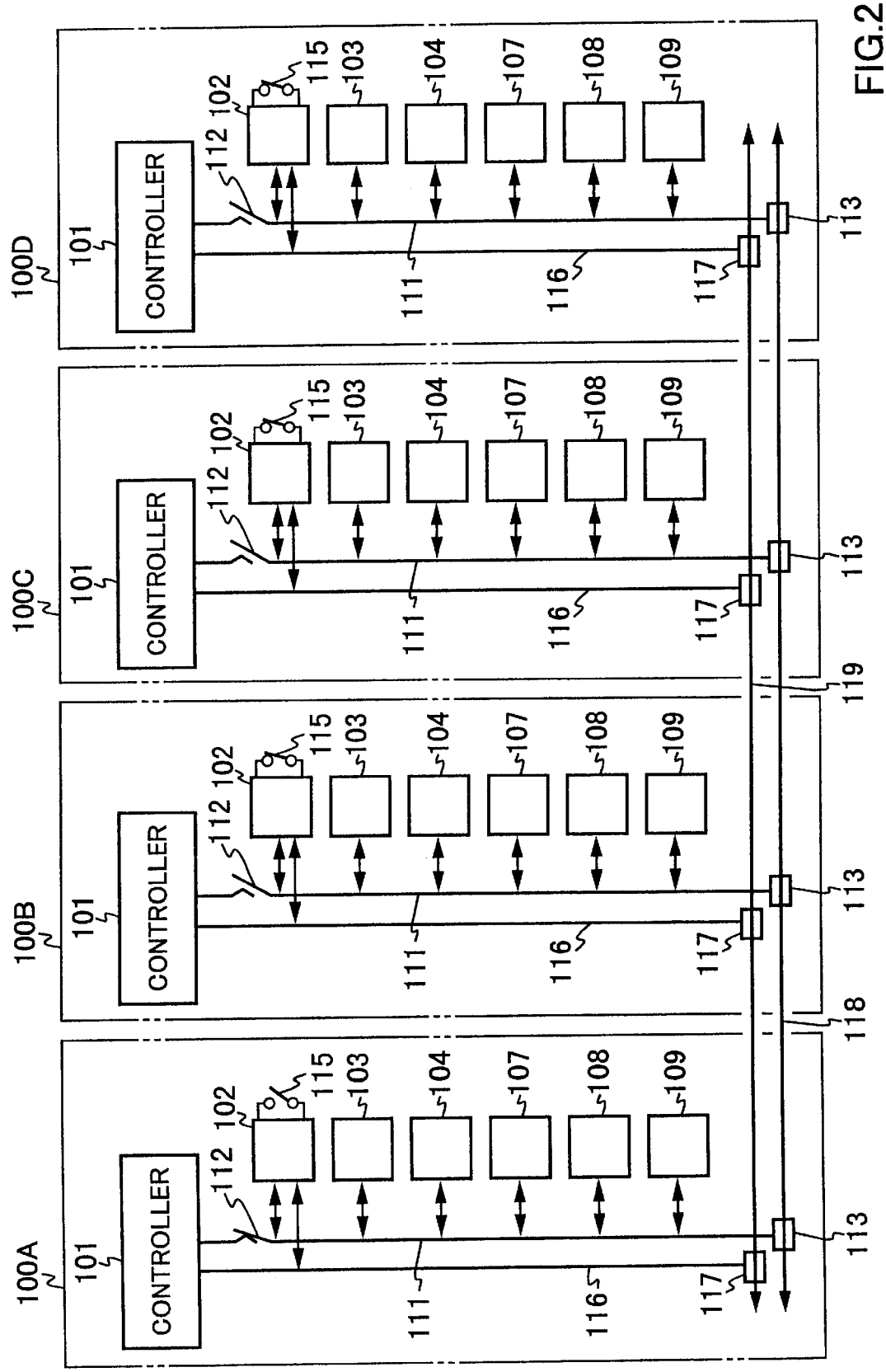
FIG. 2 is a block diagram showing, in hierarchical structure, a basic configuration of an embodiment of the composite IC tester according to the present invention.

FIG. 1 shows, in hierarchical structure, a basic configuration of an embodiment of the IC tester according to the present invention. Like the conventional IC tester shown in FIG. 5, this IC tester also comprises a controller 101, a timing generator 102, a pattern generator 103, a waveform formatter 104, drivers 105, comparators 106, a logical comparator 107, a failure analysis memory 108, a voltage generator 109, and a test head 200 (not shown). In addition, each of the pattern generator 103, the waveform formatter 104, the logical comparator 107, the failure analysis memory 108 and the voltage generator 109 is shown as one block, but they have 512 corresponding components provided therein, respectively, in this example. Similarly, the drivers 105 and the comparators 106 are provided by 512 corresponding components, respectively. Further, the drivers 105 and the comparators 106 shown within the IC tester proper 100 are usually accommodated in the test head, and so the waveform formatter 104 and the logical comparator 107 are electrically connected to the drivers 105 and the comparators 106 by 512 signal transmission paths.

In the present invention, there are provided in the IC tester proper 100 a disconnecting device (switch) 112, a bus connector (connector) 113, an original clock stopper (switch) 115, a synchronous signal transmission path or line 116, and a synchronous transmission path connector 117 (connector). The disconnecting device 112 is capable of disconnecting the controller 101 from the tester bus 111, the bus connector 113 is capable of connecting the tester bus 111 to a tester bus of an IC tester proper of another IC tester, the original clock stopper 115 stops the oscillating operation of an original clock generator or oscillator 114 provided in the timing generator 102, the synchronous signal transmission path 116 transmits a synchronous signal (a timing signal generated from the timing generator 102, in this example), and the synchronous transmission path connector 117 is capable of connecting with a synchronous signal transmission path provided in an IC tester proper of another IC tester.

Next, the operation of the IC tester thus constructed will be described.

For example, as mentioned above, the number of channels of the illustrated IC tester is assumed to be 512. In case of testing an IC having its pins the number of which is equal to or less than 512, the disconnecting device (in this embodiment, an on/off switch) 112 of the IC tester proper 100 is set to on state, thereby to maintain the electrical connection between the controller 101 and the tester bus 111 in on state. In addition, the original clock stopper (in this embodiment, an on/off switch) 115 is set to off state, thereby to maintain the original clock generator 114 in its oscillating state. Since such condition comes to the same as that of the conventional IC tester shown in FIG. 5, the IC tester can test an IC under test mounted on an IC socket of the test head, as already discussed.

Figure 5:
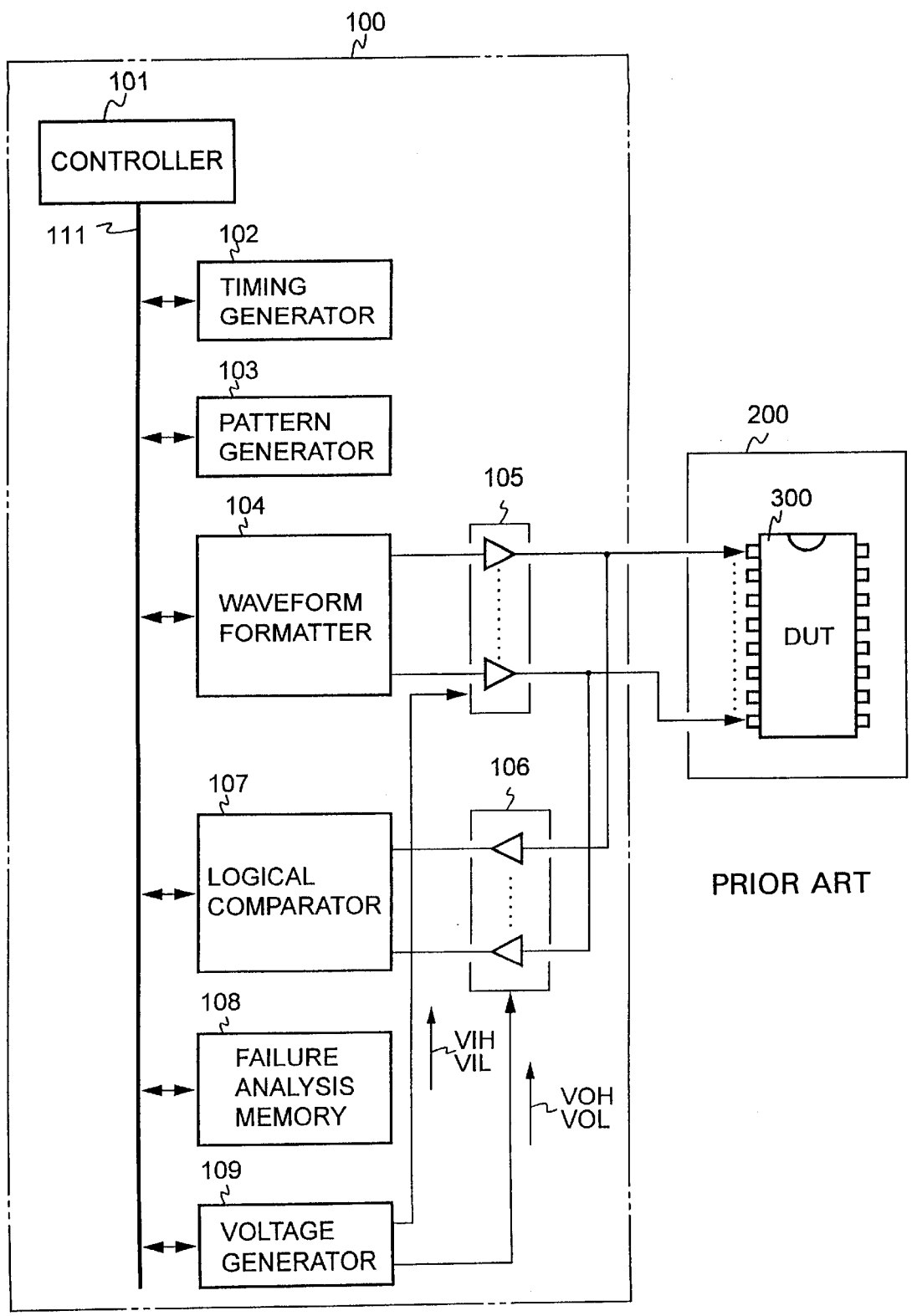
FIG. 5 is a block diagram showing, in hierarchical structure, a basic configuration of the IC tester proper shown in FIG. 4.

On the contrary, in case the number of pins of an IC under test exceeds 512, it is impossible to test such IC under test by only the IC tester having the construction shown in FIG. 5 itself. In this case as shown in FIG. 2, four IC testers proper 100 each having the construction shown in FIG. 1 (but the drivers 105 and the comparators 106 are not shown) are prepared, and the tester buses 111 of these four IC testers proper 100A, 100B, 100C and 100D are interconnected through their respective bus connectors 113. Specifically, between the four bus connectors 113 are connected four external bus cables 118 one cable between two adjacent connectors respectively so that the four tester buses 111 are connected in common. At the same time, the synchronous signal transmission paths 116 of the four IC testers proper 100A, 100B, 100C and 100D are interconnected through their respective synchronous transmission path connectors 117. Specifically, between the four synchronous transmission path connectors 117 are connected four external synchronous cables 119 one cable between two adjacent connectors respectively so that the four synchronous signal transmission paths 116 are connected in common.

Thereafter, any one of the four IC testers is determined to be a main IC tester, and the remaining three IC testers are determined to be sub IC testers. In this embodiment, the IC tester provided with the IC tester proper 100A is determined to be the main IC tester, and the IC testers provided with the IC testers proper 100B, 100C and 100D, respectively, are determined to be the sub IC testers. The disconnecting device 112 of the IC tester proper 100A of the main IC tester is set to on state, thereby to maintain the electrical connection between the controller 101 and the tester bus 111 in on state. In addition, the original clock stopper 115 of the timing generator 102 is set to off state, thereby to maintain the original clock generator 114 (refer to FIG. 1) of the timing generator 102 in operating state.

On the contrary, each of the disconnecting devices 112 of the IC testers proper 100B, 100C and 100D of the sub IC testers is set to off state, thereby to disconnect the associated tester bus 111 from the associated controller 101. In addition, each of the original clock stoppers 115 of the timing generators 102 of the respective sub IC testers is set to on state, thereby to maintain the associated original clock generator 114 of the associated timing generator 102 in unoperated state.

With such construction, a timing signal generated from the timing generator 102 of the main IC tester proper 100A is supplied as a synchronous signal to the synchronous signal transmission paths 116 of the three sub IC testers proper 100B, 100C and 100D via the synchronous signal transmission path 116 of the main IC tester proper and the external synchronous cables 119. As a result, each of the timing generators 102 of these sub IC testers proper 100B, 100C and 100D generates a timing signal in synchronism with the synchronous signal supplied from the main IC tester proper 100A, and hence the four IC testers operate in synchronous state with one another. In addition, various control instructions and/or commands, data and the like outputted from the controller 101 of the main IC tester proper 100A are supplied to the tester buses 111 of the three sub IC testers proper 100B, 100C and 100D via the tester bus 111 of the main tester proper and the external bus cables 118. Thus, the timing generator 102, the pattern generator 103, the waveform formatter 104, the logical comparator 107, the failure analysis memory 108 and the voltage generator 109 connected as terminal devices of each of the IC testers are controlled by the controller 101 of the main IC tester proper 100A, and accordingly, it is possible to operate the four IC testers in accordance with the same test program to carry out a testing for an IC under test.

Figure 3:
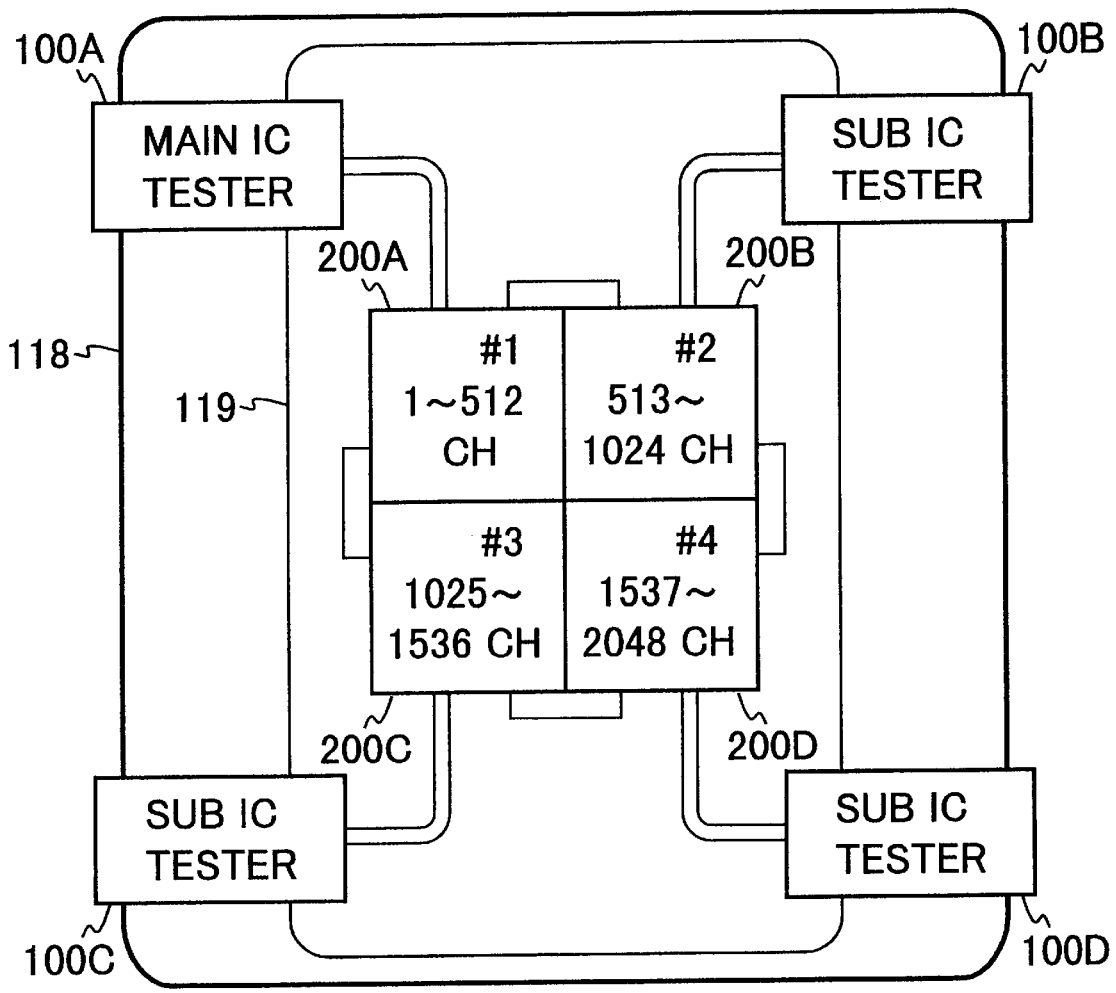
FIG. 3 is a plan view for explaining an example of arrangement of four IC testers that constitutes a composite IC tester shown in FIG. 2 and a configuration of the composite test head used in the composite IC tester.
Figure 4:
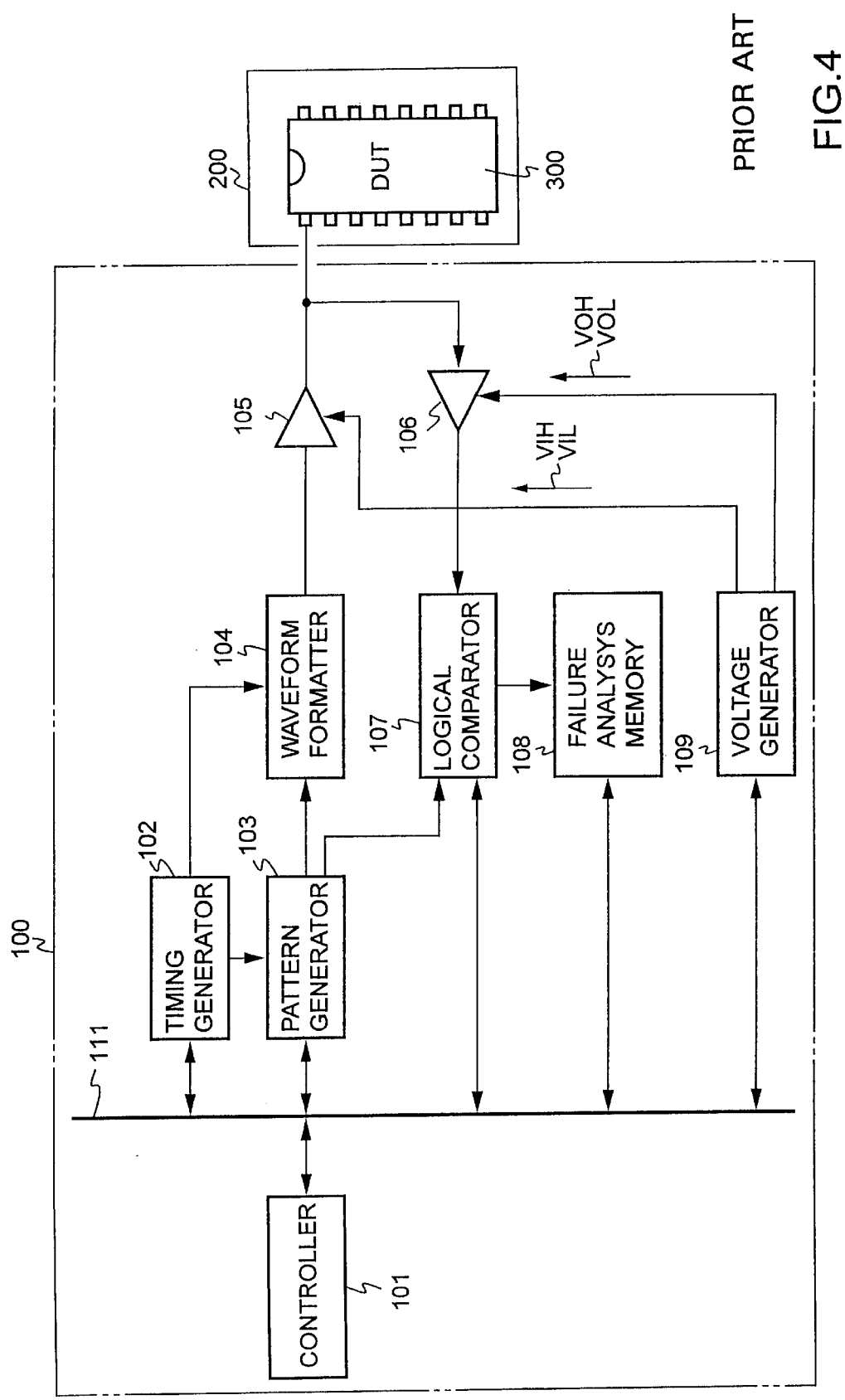
FIG. 4 is a block diagram showing a basic configuration of an example of the conventional IC tester.

In case four IC testers are combined into one composite IC tester as described above, test heads 200A, 200B, 200C and 200D of the four IC testers are also combined into one composite test head as shown in FIG. 3. The number of pins of an IC under test that can be tested by the composite test head 200A, 200B, 200C and 200D comes to four times larger because the number of combined test heads is four in this embodiment. Accordingly, if the main IC tester proper 100A has charge of channels 1 through 512, the first sub IC tester proper 100B has charge of channels 513 through 1024, the second sub IC tester proper 100C has charge of channels 1025 through 1536, and the third sub IC tester proper 100D has charge of channels 1537 to 2048, they operate in the very same manner as one IC tester having 2048 channels operates. Consequently, an IC under test having its pins up to 2048 pins can be tested by the composite IC tester without imposing a heavy economical burden on the user.

Further, in the above-described embodiment, four general purpose IC testers each having the construction shown in FIG. 1 have been combined to construct one composite IC tester, but it is needless to say that the number of general purpose IC testers to be combined can be appropriately increased or decreased depending upon the number of pins of an IC under test. In addition, in case a general purpose IC tester provided with two test heads is used, it is possible by merely coupling two test heads with each other to cause the IC tester to operate in the very same manner as one IC tester having its channels doubled operates. In this case, there is an advantage that the external bus cables 118 and the external synchronous cables 119 are not necessary. It goes without saying that the configuration or construction of the general purpose IC tester is not limited to that shown in the drawings.

As is apparent from the foregoing description, in the present invention, since a general purpose IC tester is constructed such that it can be combined with another general purpose IC tester having the same construction, it is a matter of course that the general purpose IC tester can be utilized as per usual as a general purpose IC tester for testing an IC having its pins equal to or less than a predetermined number of pins. Moreover, in case it is desired to test an IC having a multiplicity of pins by the general purpose IC tester, a plurality of the general purpose IC testers can be combined into one composite IC tester which can operate to test an IC having a multiplicity of pins. With this composite IC tester, the number of pins of an IC that can be tested by it can be increased to a value multiplied by the number of combined IC testers. As a result, an IC having many pins can be tested by the composite IC tester without using an extremely expensive IC tester especially developed for an IC having many pins. Accordingly, the economical burden to be imposed on a user is significantly reduced, which results in a remarkable effect when the composite IC tester is put to practical use.

Heretofore, in developing ICs, the number of pins of an IC has been limited by the number of pins that can be tested by an IC tester for testing and measuring the IC. However, according to the present invention, there is an advantage that it is possible to develop ICs without paying attention to the number of pins that can be tested by an IC tester.

While the present invention has been described with regard to the preferred embodiment shown by way of example, it will be apparent to those skilled in the art that various modifications, alterations, changes, and/or minor improvements of the embodiment described above can be made without departing from the spirit and the scope of the present invention. Accordingly, it should be understood that the present invention is not limited to the illustrated embodiment, and is intended to encompass all such modifications, alterations, changes, and/or minor improvements falling within the scope of the invention defined by the appended claims.

What is claimed is:

1. A semiconductor integrated circuit testing apparatus comprising: a controller constituted by a computer system; a tester bus connected to said controller; and a plurality of terminal devices including timing generating means, said terminal devices being connected to said tester bus for receiving control instructions, commands or data from said controller via said tester bus, said semiconductor integrated circuit testing apparatus further comprising:

disconnecting means for disconnecting said controller from said tester bus;

bus connecting means for enabling to connect said tester bus to a tester bus of another semiconductor integrated circuit testing apparatus;

original clock stopping means for stopping the operation of an original clock generator of said timing generating means;

synchronous signal transmission means connected to said timing generating means; and synchronous signal transmission means connecting means for enabling to connect said synchronous signal transmission means to synchronous signal transmission means of another semiconductor integrated circuit testing apparatus.

2. The semiconductor integrated circuit testing apparatus as set forth in claim 1, further including a test head which is constructed separately from said semiconductor integrated circuit testing apparatus and is provided with a socket on which a semiconductor integrated circuit under test is to be mounted.

3. The semiconductor integrated circuit testing apparatus as set forth in claim 1, wherein in case a semiconductor integrated circuit under test is tested by said semiconductor integrated circuit testing apparatus, said disconnecting means is not operated so that said controller and said tester bus are connected with each other, and said original clock stopping means is not operated so that the original clock generator of the timing generating means is maintained in operating state.

4. The semiconductor integrated circuit testing apparatus as set forth in claim 2, wherein in case a semiconductor integrated circuit under test is tested by said semiconductor integrated circuit testing apparatus, said disconnecting means is not operated so that said controller and said tester bus are connected with each other, and said original clock stopping means is not operated so that the original clock generator of the timing generating means is maintained in operating state.

5. The semiconductor integrated circuit testing apparatus as set forth in claim 1, wherein said terminal devices include pattern generating means, a waveform formatter, logical comparator means, a failure analysis memory, and voltage generating means.

6. A composite semiconductor integrated circuit testing apparatus in which:

a plurality of semiconductor integrated circuit testing apparatus each of which is recited in claim 1 have a plurality of tester buses with respective tester bus connecting means, and a plurality of synchronous signal transmission means with respective synchronous signal transmission means connecting means;

the tester buses of said plurality of semiconductor integrated circuit testing apparatus are connected with each other by their respective tester bus connecting means; and the synchronous signal transmission means of said plurality of semiconductor integrated circuit testing apparatus are connected with each other by their respective synchronous signal transmission means connecting means.

7. A composite semiconductor integrated circuit testing apparatus in which:

a plurality of semiconductor integrated circuit testing apparatus each of which is recited in claim 2 have a plurality of tester buses with respective tester bus connecting means, a plurality of synchronous signal transmission means with respective synchronous signal transmission means connecting means, and a plurality of test heads;

the tester buses of said plurality of semiconductor integrated circuit testing apparatus are connected with each other by their respective tester bus connecting means;

the synchronous signal transmission means of said plurality of semiconductor integrated circuit testing apparatus are connected with each other by their respective synchronous signal transmission means connecting means; and the test heads of said plurality of semiconductor integrated circuit testing apparatus are combined into one composite test head.

8. A composite semiconductor integrated circuit testing apparatus in which:

a plurality of semiconductor integrated circuit testing apparatus each of which is recited in claim 5 have a plurality of tester buses with respective tester bus connecting means, and a plurality of synchronous signal transmission means with respective synchronous signal transmission means connecting means;

the tester buses of said plurality of semiconductor integrated circuit testing apparatus are connected with each other by their respective tester bus connecting means; and the synchronous signal transmission means of said plurality of semiconductor integrated circuit testing apparatus are connected with each other by their respective synchronous signal transmission means connecting means.

9. The composite semiconductor integrated circuit testing apparatus as set forth in claim 6, wherein:

only the disconnecting means of specified one of said plurality of semiconductor integrated circuit testing apparatus is not operated so that the controller and the tester bus thereof are connected with each other, the disconnecting means of the remaining semiconductor integrated circuit testing apparatus being operated so that the associated controller and the associated tester bus are disconnected from each other; and only the original clock stopping means of said specified one semiconductor integrated circuit testing apparatus is not operated, thereby to maintain the original clock generator of the timing generating means thereof in operating state, the original clock stopping means of the remaining semiconductor integrated circuit testing apparatus being operated thereby maintaining the original clock generator of the associated timing generating means in unoperated state.

10. The composite semiconductor integrated circuit testing apparatus as set forth in claim 7, wherein:

only the disconnecting means of specified one of said plurality of semiconductor integrated circuit testing apparatus is not operated so that the controller and the tester bus thereof are connected with each other, the disconnecting means of the remaining semiconductor integrated circuit testing apparatus being operated so that the associated controller and the associated tester bus are disconnected from each other; and only the original clock stopping means of said specified one semiconductor integrated circuit testing apparatus is not operated, thereby to maintain the original clock generator of the timing generating means thereof in operating state, the original clock stopping means of the remaining semiconductor integrated circuit testing apparatus being operated thereby maintaining the original clock generator of the associated timing generating means in unoperated state.

11. The composite semiconductor integrated circuit testing apparatus as set forth in claim 8, wherein:

only the disconnecting means of specified one of said plurality of semiconductor integrated circuit testing apparatus is not operated so that the controller and the tester bus thereof are connected with each other, the disconnecting means of the remaining semiconductor integrated circuit testing apparatus being operated so that the associated controller and the associated tester bus are disconnected from each other; and only the original clock stopping means of said specified one semiconductor integrated circuit testing apparatus is not operated, thereby to maintain the original clock generator of the timing generating means thereof in operating state, the original clock stopping means of the remaining semiconductor integrated circuit testing apparatus being operated thereby maintaining the original clock generator of the associated timing generating means in unoperated state.

12. The composite semiconductor integrated circuit testing apparatus as set forth in claim 6, wherein specified one of said plurality of semiconductor integrated circuit testing apparatus is defined to be a main semiconductor integrated circuit testing apparatus in which the controller and the tester bus thereof are connected with each other so that it operates in normal mode, the remaining semiconductor integrated circuit testing apparatus being defined to be a sub semiconductor integrated circuit testing apparatus in which the controller and the tester bus thereof are disconnected from each other and the original clock generator of the timing generating means thereof is controlled to be in stopped state; and wherein the tester bus of said main semiconductor integrated circuit testing apparatus is connected to the tester bus or buses of said sub semiconductor integrated circuit testing apparatus so that said sub semiconductor integrated circuit testing apparatus can be operated by the controller of said main semiconductor integrated circuit testing apparatus whereby the composite semiconductor integrated circuit testing apparatus is capable of testing a semiconductor integrated circuit having its pins up to the sum of the number of pins that can be tested by said main semiconductor integrated circuit testing apparatus and the number of pins that can be tested by said sub semiconductor integrated circuit testing apparatus.

13. The composite semiconductor integrated circuit testing apparatus as set forth in claim 7, wherein specified one of said plurality of semiconductor integrated circuit testing apparatus is defined to be a main semiconductor integrated circuit testing apparatus in which the controller and the tester bus thereof are connected with each other so that it operates in normal mode, the remaining semiconductor integrated circuit testing apparatus being defined to be a sub semiconductor integrated circuit testing apparatus in which the controller and the tester bus thereof are disconnected from each other and the original clock generator of the timing generating means thereof is controlled to be in stopped state; and wherein the tester bus of said main semiconductor integrated circuit testing apparatus is connected to the tester bus or buses of said sub semiconductor integrated circuit testing apparatus so that said sub semiconductor integrated circuit testing apparatus can be operated by the controller of said main semiconductor integrated circuit testing apparatus whereby the composite semiconductor integrated circuit testing apparatus is capable of testing a semiconductor integrated circuit having its pins up to the sum of the number of pins that can be tested by said main semiconductor integrated circuit testing apparatus and the number of pins that can be tested by said sub semiconductor integrated circuit testing apparatus.

14. The composite semiconductor integrated circuit testing apparatus as set forth in claim 8, wherein specified one of said plurality of semiconductor integrated circuit testing apparatus is defined to be a main semiconductor integrated circuit testing apparatus in which the controller and the tester bus thereof are connected with each other so that it operates in normal mode, the remaining semiconductor integrated circuit testing apparatus being defined to be a sub semiconductor integrated circuit testing apparatus in which the controller and the tester bus thereof are disconnected from each other and the original clock generator of the timing generating means thereof is controlled to be in stopped state; and wherein the tester bus of said main semiconductor integrated circuit testing apparatus is connected to the tester bus or buses of said sub semiconductor integrated circuit testing apparatus so that said sub semiconductor integrated circuit testing apparatus can be operated by the controller of said main semiconductor integrated circuit testing apparatus whereby the composite semiconductor integrated circuit testing apparatus is capable of testing a semiconductor integrated circuit having its pins up to the sum of the number of pins that can be tested by said main semiconductor integrated circuit testing apparatus and the number of pins that can be tested by said sub semiconductor integrated circuit testing apparatus.

15. A semiconductor integrated circuit testing system comprising:

a plurality of semiconductor integrated circuit testing apparatuses each of which is recited in claim 1;

an external bus cable to which each of the tester buses of respective said testing apparatuses is selectively connected or disconnected by each of respective said bus connecting means; and an external synchronous cable to which each of the synchronous signal transmission means of respective said testing apparatuses is selectively connected or disconnected by each of respective said synchronous signal transmission means connecting means.

* * * * *